United States Patent
La Tulipe, Jr. et al.

(10) Patent No.: US 8,765,578 B2
(45) Date of Patent: Jul. 1, 2014

(54) EDGE PROTECTION OF BONDED WAFERS DURING WAFER THINNING

(75) Inventors: Douglas C. La Tulipe, Jr., Guilderland, NY (US); Spyridon Skordas, Wappingers Falls, NY (US); Tuan A. Vo, Albany, NY (US); Kevin R. Winstel, East Greenbush, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 13/489,861

(22) Filed: Jun. 6, 2012

(65) Prior Publication Data
US 2013/0328174 A1    Dec. 12, 2013

(51) Int. Cl.
*H01L 21/30*    (2006.01)

(52) U.S. Cl.
USPC ........... 438/459; 438/455; 438/456; 438/458; 438/463; 438/465

(58) Field of Classification Search
USPC .......... 438/455, 456, 457, 458, 459, 463, 465
See application file for complete search history.

(56) References Cited

U.S. PATENT DOCUMENTS

| | | | | |
|---|---|---|---|---|
| 3,579,816 A | * | 5/1971 | Ingraham et al. | 438/109 |
| 4,638,553 A | * | 1/1987 | Nilarp | 438/458 |
| 6,391,743 B1 | * | 5/2002 | Iwane et al. | 438/458 |
| 6,991,944 B2 | | 1/2006 | Rayssac et al. | |
| 7,288,489 B2 | | 10/2007 | Dolechek et al. | |
| 7,371,612 B2 | * | 5/2008 | Ball | 438/113 |
| 7,592,239 B2 | * | 9/2009 | Park et al. | 438/479 |
| 7,625,821 B2 | | 12/2009 | Dolechek et al. | |
| 7,645,628 B2 | | 1/2010 | Perkins | |
| 7,855,129 B2 | * | 12/2010 | Morita et al. | 438/459 |
| 8,119,500 B2 | * | 2/2012 | Yang et al. | 438/459 |
| 8,173,522 B2 | * | 5/2012 | Jakob et al. | 438/460 |
| 8,287,980 B2 | * | 10/2012 | Farooq et al. | 428/66.7 |
| 8,426,957 B2 | * | 4/2013 | Haba et al. | 257/686 |
| 8,431,435 B2 | * | 4/2013 | Haba et al. | 438/106 |
| 2002/0031864 A1 | * | 3/2002 | Ball | 438/113 |
| 2010/0255682 A1 | * | 10/2010 | Trickett et al. | 438/692 |
| 2011/0065238 A1 | * | 3/2011 | Chiou et al. | 438/107 |
| 2011/0104426 A1 | * | 5/2011 | Farooq et al. | 428/64.1 |
| 2011/0117691 A1 | * | 5/2011 | Broekaart et al. | 438/73 |
| 2011/0183495 A1 | * | 7/2011 | Sousbie et al. | 438/459 |
| 2013/0014803 A1 | * | 1/2013 | Varghese | 136/244 |

OTHER PUBLICATIONS

Anonymous, "Method for sealed edges of bonded wafers for 3D wafer-stacking applications", ip.com, IP.com No. IPCOM000012779D, May 28, 2003, all pages.

* cited by examiner

*Primary Examiner* — Matthew W Such
*Assistant Examiner* — Stephen C Smith
(74) *Attorney, Agent, or Firm* — Ira D. Blecker; Ian D. MacKinnon

(57) ABSTRACT

A method of edge protecting bonded semiconductor wafers. A second semiconductor wafer and a first semiconductor wafer are attached by a bonding layer/interface and the second semiconductor wafer undergoes a thinning process. As a part of the thinning process, a first protective layer is applied to the edges of the second and first semiconductor wafers. A third semiconductor wafer is attached to the second semiconductor wafer by a bonding layer/interface and the third semiconductor wafer undergoes a thinning process. As a part of the thinning process, a second protective layer is applied to the edges of the third semiconductor wafer and over the first protective layer. The first, second and third semiconductor wafers form a wafer stack. The wafer stack is diced into a plurality of 3D chips while maintaining the first and second protective layers.

17 Claims, 14 Drawing Sheets

EDGE PROTECTION OF BONDED WAFERS DURING WAFER THINNING

BACKGROUND

The present invention relates to protecting the edge of bonded semiconductor wafers and, more particularly, relates to protecting the edge of a stack of bonded semiconductor wafers during wafer thinning.

In one possible scheme for wafer-scale bonding three-dimension (3D) integration, the top wafer may be bonded face down to the bottom wafer. In general, wafer-scale bonding may be face-to-face bonding or face-to-back bonding. Subsequently, the top wafer is ground and polished from the back in order to leave a relatively thin portion of the top wafer, so that the through-silicon via definition that will facilitate electrical connection is possible. However, grinding mechanically the top wafer to a very small thickness can be very risky and can yield to several process yield issues, such as chipping or cracking, and uniformity issues regarding the remaining wafer thickness. In one possible approach to circumvent this issue, the final wafer thinning step can be done by use of a wet thinning process and thickness and uniformity of the remaining silicon can be influenced by appropriate material selection. However, the wet thinning process is also known to attack dielectric films and carrier wafer surfaces as well.

BRIEF SUMMARY

The various advantages and purposes of the exemplary embodiments as described above and hereafter are achieved by providing, according to a first aspect of the exemplary embodiments, a method of edge protecting bonded semiconductor wafers comprising: providing a second semiconductor wafer having a first surface and a second surface opposite to the first surface; attaching the first surface of the first semiconductor wafer to a first semiconductor wafer by using a bonding layer/interface; thinning the second semiconductor wafer from the second surface to a first predetermined dimension; forming a first protective layer to entirely cover the second semiconductor wafer and at least a portion of an edge of the first semiconductor wafer; thinning the second semiconductor wafer from the second surface to a second predetermined dimension while maintaining the first protective layer on an edge of the second semiconductor wafer and the edge of the first semiconductor wafer; providing a third semiconductor wafer having a first surface and a second surface opposite to the first surface; attaching the first surface of the third semiconductor wafer to the second surface of the second semiconductor wafer by using a bonding layer/interface, the third semiconductor wafer, second semiconductor wafer and first semiconductor wafer forming a semiconductor wafer stack; thinning the third semiconductor wafer from the second surface to a third predetermined dimension; forming a second protective layer to entirely cover the third semiconductor wafer and the first protective layer; thinning the third semiconductor wafer to a fourth predetermined dimension while maintaining the second protective layer on an edge of the third semiconductor wafer and on the first protective layer; and dicing the semiconductor wafer stack with the maintained second protective layer and first protective layer into a plurality of three dimensional chip stacks.

According to a second aspect of the exemplary embodiments, there is provided a method of edge protecting bonded semiconductor wafers comprising: providing a second semiconductor wafer having a first surface and a second surface opposite to the first surface; attaching the first surface of the second semiconductor wafer to a first semiconductor wafer by using a bonding layer/interface, the second semiconductor wafer and the first semiconductor wafer forming a semiconductor wafer stack; thinning the second semiconductor wafer from the second surface to a first predetermined dimension; forming a protective layer to entirely cover the second semiconductor wafer and at least a portion of an edge of the first semiconductor wafer; thinning the second semiconductor wafer from the second surface to a second predetermined dimension while maintaining the first protective layer on an edge of the second semiconductor wafer and the edge of the first semiconductor wafer; bonding an additional semiconductor wafer to, and become part of, the semiconductor wafer stack according to the following process: providing an additional semiconductor wafer having a first surface and a second surface opposite to the first surface; attaching the first surface of the additional semiconductor wafer to the second surface of a preceding semiconductor wafer by using a bonding layer/interface; thinning the additional semiconductor wafer from the second surface to a first predetermined dimension with respect to the additional semiconductor wafer; forming a protective layer to entirely cover the additional semiconductor wafer and a preceding protective layer; and thinning the additional semiconductor wafer to a second predetermined dimension with respect to the additional semiconductor wafer while maintaining the additional semiconductor wafer protective layer on an edge of the additional semiconductor wafer and on the preceding protective layer; and dicing the semiconductor wafer stack with the maintained additional semiconductor wafer protective layer and preceding protective layer into a plurality of three dimensional chip stacks.

According to a third aspect of the exemplary embodiments, there is provided edge protected bonded semiconductor wafers which includes: a second semiconductor wafer having a first surface and a second surface opposite to the first surface, the first surface of the second semiconductor wafer attached to a first semiconductor wafer by using a bonding layer/interface; a first protective layer formed to entirely cover the second semiconductor wafer and at least a portion of an edge of the first semiconductor wafer; a third semiconductor wafer having a first surface and a second surface opposite to the first surface, the first surface of the third semiconductor wafer attached to the second surface of the second semiconductor wafer by using a bonding layer/interface; and a second protective layer to entirely cover the third semiconductor wafer and the first protective layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 13 illustrate a first exemplary embodiment of bonded semiconductor wafers wherein:

FIG. 1 illustrates a second semiconductor wafer bonded to a first or bottom semiconductor wafer;

FIG. 2 illustrates a first thinning process, preferably but not exclusively mechanical grinding, to reduce the thickness of the second semiconductor wafer to a first predetermined dimension;

FIG. 3 illustrates a first protective coating conformally deposited on the bonded semiconductor wafers;

FIG. 4 illustrates a thinning operation, preferably but not exclusively mechanical grinding, to remove the protective coating from the top of the second semiconductor wafer;

FIG. 5 illustrates a second thinning process, preferably but not exclusively wet etching, to reduce the thickness of the second semiconductor wafer to a second predetermined dimension;

FIG. 6 illustrates the result of a polishing process to remove possible remnants of the first protective coating;

FIG. 7 illustrates the bonding of a third semiconductor wafer to the second semiconductor wafer;

FIG. 8 illustrates a first thinning process, preferably but not exclusively mechanical grinding, to reduce the thickness of the third semiconductor wafer to a first predetermined dimension;

FIG. 9 illustrates a second protective coating conformally deposited on the third semiconductor wafer and the first protective coating;

FIG. 10 illustrates a thinning operation, preferably but not exclusively mechanical grinding, to remove the protective coating from the top of the third semiconductor wafer;

FIG. 11 illustrates a second thinning process, preferably but not exclusively wet etching, to reduce the thickness of the third semiconductor wafer to a second predetermined dimension;

FIG. 12 illustrates the result of a polishing process to remove possible remnants of the second protective coating; and FIG. 13 illustrates the dicing of the bonded semiconductor wafers into 3D semiconductor chips.

FIGS. 1, 2 and 14 to 26 illustrate a second exemplary embodiment of bonded semiconductor wafers wherein:

FIG. 1 illustrates a second semiconductor wafer bonded to a first or bottom semiconductor wafer;

FIG. 2 illustrates a first thinning process, preferably but not exclusively mechanical grinding, to reduce the thickness of the second semiconductor wafer to a first predetermined dimension;

FIG. 14 illustrates a wafer edge trimming operation of the second semiconductor wafer and optionally, partially trimming the bottom semiconductor wafer;

FIG. 15 illustrates a first protective coating conformally deposited on the bonded semiconductor wafers;

FIG. 16 illustrates a thinning operation, preferably but not exclusively mechanical grinding, to remove the protective coating from the top of the second semiconductor wafer;

FIG. 17 illustrates a second thinning process, preferably but not exclusively wet etching, to reduce the thickness of the second semiconductor wafer to a second predetermined dimension;

FIG. 18 illustrates the result of a polishing process to remove possible remnants of the first protective coating;

FIG. 19 illustrates the bonding of a third semiconductor wafer to the second semiconductor wafer;

FIG. 20 illustrates a first thinning process, preferably but not exclusively mechanical grinding, to reduce the thickness of the third semiconductor wafer to a first predetermined dimension;

FIG. 21 illustrates a wafer edge trimming operation of the third semiconductor wafer;

FIG. 22 illustrates a second protective coating conformally deposited on the third semiconductor wafer and the first protective coating;

FIG. 23 illustrates a thinning operation, preferably but not exclusively mechanical grinding, to remove the protective coating from the top of the third semiconductor wafer;

FIG. 24 illustrates a second thinning process, preferably but not exclusively wet etching, to reduce the thickness of the third semiconductor wafer to a second predetermined dimension;

FIG. 25 illustrates the result of a polishing process to remove possible remnants of the second protective coating; and FIG. 26 illustrates the dicing of the bonded semiconductor wafers into 3D semiconductor chips.

FIGS. 27 and 28 illustrate a third exemplary embodiment of bonded semiconductor wafers wherein:

FIG. 27 illustrates a bonded semiconductor wafer stack of first or bottom semiconductor wafer, second semiconductor wafer, third semiconductor wafer and fourth semiconductor wafer and first, second and third protective coatings; and FIG. 28 illustrates the dicing of the bonded semiconductor wafer stack into 3D semiconductor chips.

DETAILED DESCRIPTION

The present inventors propose to protect the edges of bonded semiconductor wafers during wafer thinning processing and subsequent processing operations until the time the semiconductor wafers are diced to form 3D semiconductor chips.

A first exemplary embodiment is illustrated in FIGS. 1 to 13.

Figure 1:
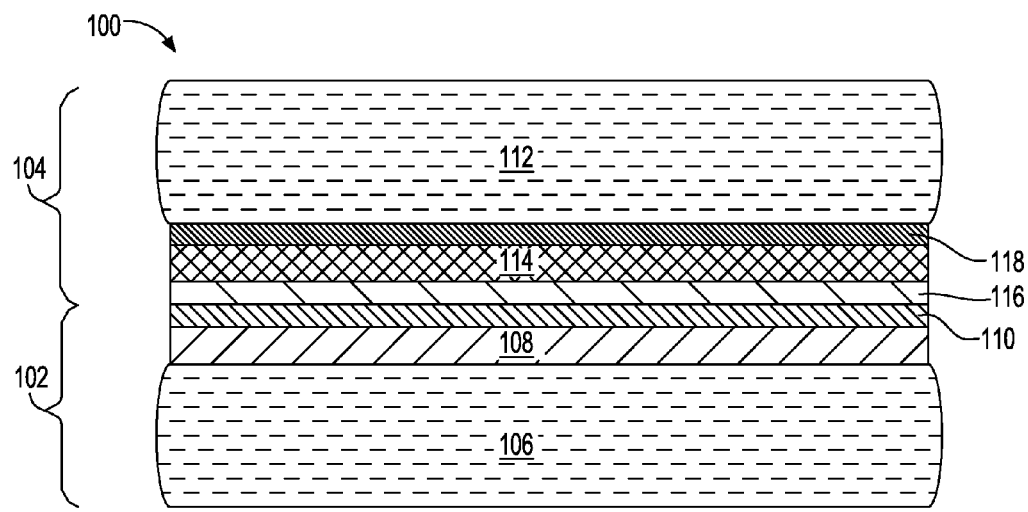

Referring to the Figures in more detail, and particularly referring to FIG. 1, there are shown bonded semiconductor wafers 100 which may include a first semiconductor wafer 102 bonded to a second semiconductor wafer 104. The first semiconductor wafer 102 may also be referred to as a bottom wafer. First semiconductor wafer 102 includes a bulk silicon substrate 106, a device layer 108 and a bonding layer/interface 110. The device layer 108 may actually comprise several sublayers in which semiconductor devices and interconnect wiring may be formed.

Second semiconductor wafer 104 may also include a bulk silicon substrate 112, a device layer 114 and a bonding layer/interface 116. Again, the device layer 114 may actually comprise several sublayers in which semiconductor devices and interconnect wiring may be formed. The second semiconductor wafer 104 may additionally include other layers such as layer 118, which may be an epitaxial silicon layer.

First semiconductor wafer 102 is bonded to second semiconductor wafer 104 through the respective bonding layers/interfaces 110 and 116 in a face-to-face arrangement. The bonding layers/interfaces 110 and 116 can be any type of such materials/structures known to the ones skilled in the art and used in wafer bonding, such as in oxide/silicon fusion bonding, metal-metal bonding, adhesive bonding, etc.

While the bonding layers/interfaces 110, 116 may be referred to as being part of the first semiconductor wafer 102 and the second semiconductor wafer 104, it should be understood that in this first exemplary embodiment (as well as the other exemplary embodiments discussed hereafter), the bonding layers/interfaces 110, 116 may be separate from the first semiconductor wafer 102 and the second semiconductor wafer 104.

Figure 2:
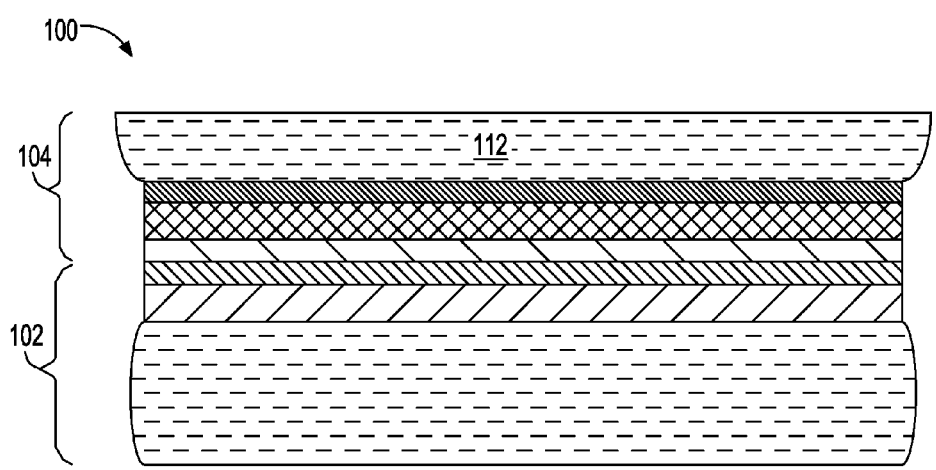

The bonded semiconductor wafers 100 undergo a first conventional thinning operation, preferably but not exclusively mechanical grinding, to reduce the thickness of the bulk silicon substrate 112 to a predetermined dimension. Conventional grinding may be used to reduce the thickness of the bulk silicon substrate 112 without unduly causing cracks or chips in semiconductor wafers 100. The bonded semiconductor wafers 100 with the reduced thickness of bulk silicon substrate 112 is shown in FIG. 2.

Figure 3:
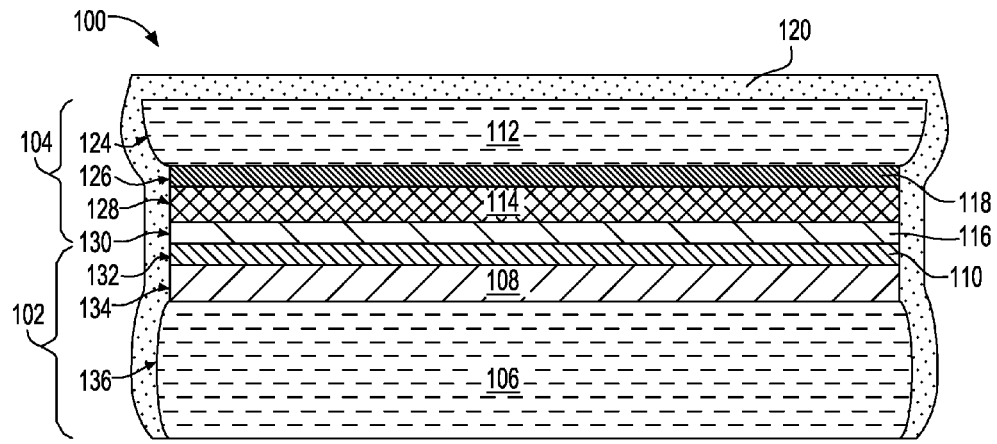

Referring now to FIG. 3, a conformal protective layer 120 may be applied to the bonded semiconductor wafers 100. The conformal protective layer 120 may be applied by a process such as chemical vapor deposition (CVD), plasma-enhanced CVD (PECVD), plasma-enhanced atomic layer deposition (PEALD), atomic layer deposition (ALD) or other conformal film deposition technique and may be a silicon nitride, silicon carbide, silicon carbonitride (NBLOK) or other materials that are known to be resistant to wet chemistries that will be used subsequently for wet etching. The protective layer 120 covers the top of bulk silicon substrate 112 as well as the edges 124, 126, 128, 130, 132, 134, respectively, of bulk silicon substrate 112, epitaxial layer 118, device layer 114, bonding layers/interfaces 116, 110 and device layer 108. In an exemplary embodiment, the protective layer 120 at least partially covers the edge 136 of bulk silicon substrate 106 and, most preferably, entirely covers the edge 136 of bulk silicon substrate 106.

Figure 4:
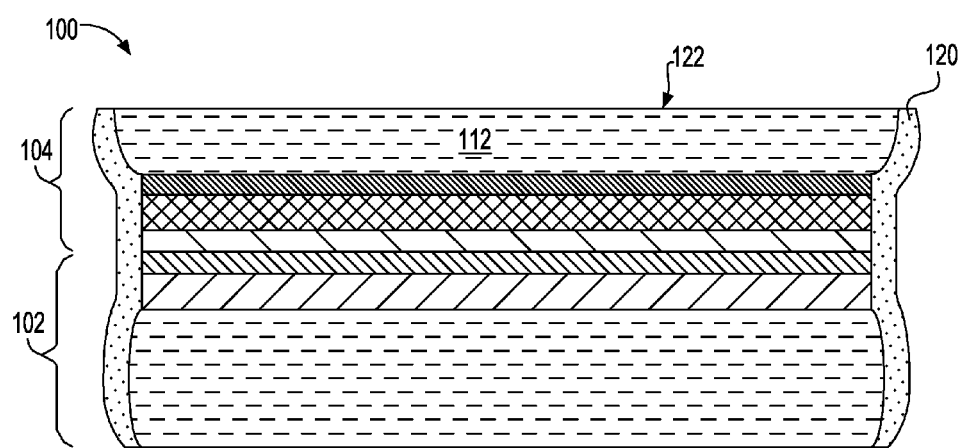

The semiconductor wafers 100 now may undergo another thinning operation, preferably but not exclusively mechanical grinding, to remove the protective layer 120 from the top of bulk silicon substrate 112 to expose surface 122 of bulk silicon substrate 112. This thinning operation may not appreciably reduce the thickness of the semiconductor wafer 104. FIG. 4 illustrates the semiconductor wafers 100 after removal of the protective layer 120 from bulk silicon substrate 112.

Figure 5:
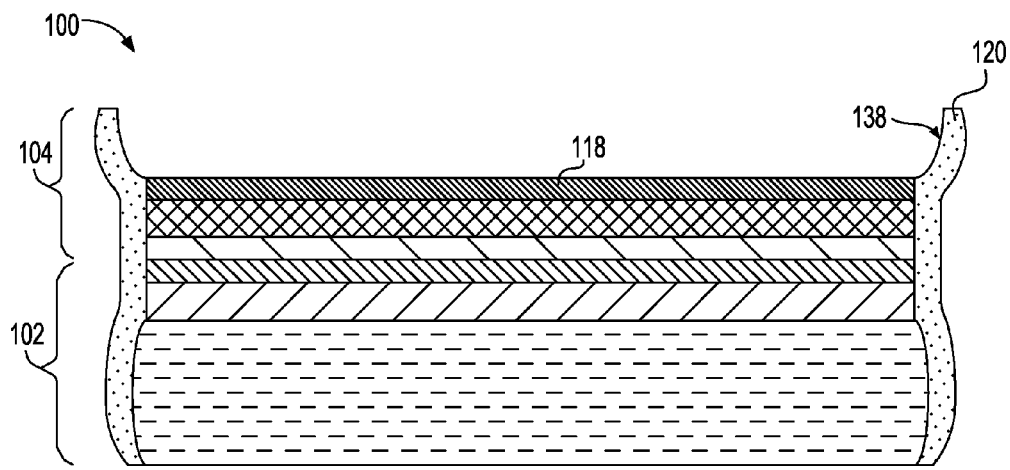
Figure 6:
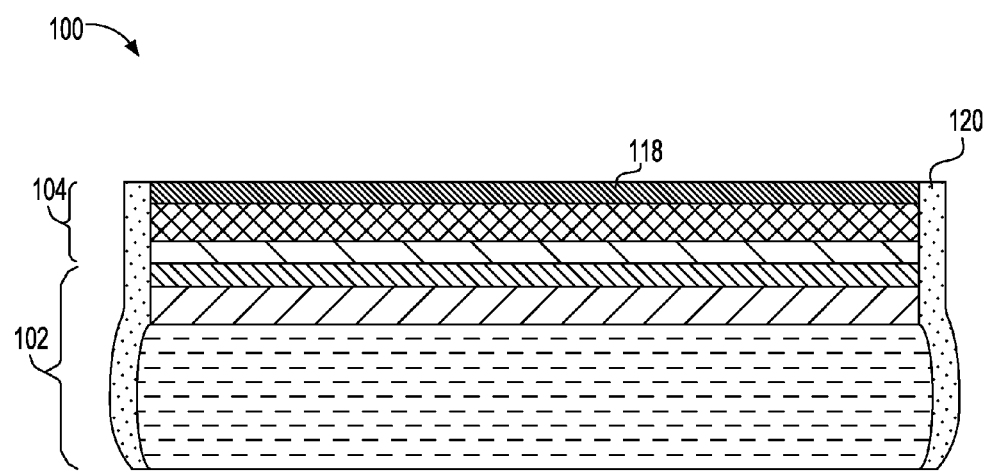

A further operation may be performed to reduce the thickness of the bulk silicon substrate 112 to a final predetermined dimension. In an exemplary embodiment, the thinning of the bulk silicon substrate 112 may stop on epitaxial layer 118. While the thinning of the bulk silicon substrate 112 to the final predetermined dimension may be by a grinding and polishing process, it is preferred that this thinning operation is by a wet etching process to reduce the possibility of cracks and chips in the semiconductor wafers 100. Epitaxial layer 118 may be an epitaxial silicon layer, doped to a level so that it is resistant to wet etch chemistries that will etch bulk silicon. Other materials, such as silicon oxide, may be substituted for epitaxial layer 118. The wet etching process also improves total thickness variation at a minimum, as such a process stops naturally at the wet etch-resistant layer. Such wet etching chemistries may be tetramethylammonium hydroxide (TMAH) solutions, potassium hydroxide (KOH) solutions, and other such chemistries that can etch bulk silicon or other semiconductor materials at room or elevated temperature while stopping at the wet-etch stop layer and that are known to ones skilled in the art. As a result of the wet etching process, possible remnants 138 of the protective layer 120 may remain as shown in FIG. 5. If such remnants 138 are present, a light polish may be performed to remove the remnants 138, resulting in the bonded semiconductor wafers 100 shown in FIG. 6. At this point in the process, after the second semiconductor wafer 104 is sufficiently thinned, processing may continue in order to electrically connect the semiconductor wafers 102, 104 by use of through silicon vias and back end of line wiring. It is also possible that wafer stacking may continue in the same fashion and such connections may be established later when more semiconductor wafers have been stacked.

Figure 7:
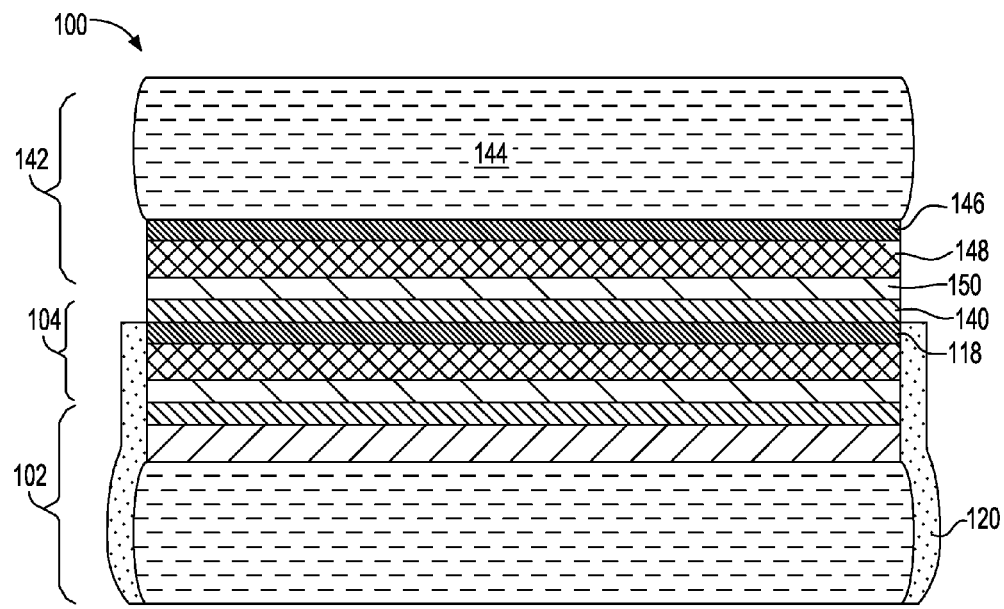

Referring now to FIG. 7, a bonding layer/interface 140 may be applied to semiconductor wafer 104, for example to epitaxial layer 118, followed by the bonding of a third semiconductor wafer 142 to the bonding layer/interface 140. Third semiconductor wafer 142 may comprise a bulk silicon substrate 144, an optional epitaxial layer 146, a device layer 148 and a bonding layer/interface 150.

Third semiconductor wafer 142 may be processed in much the same way as second semiconductor wafer 104 was processed.

Figure 8:
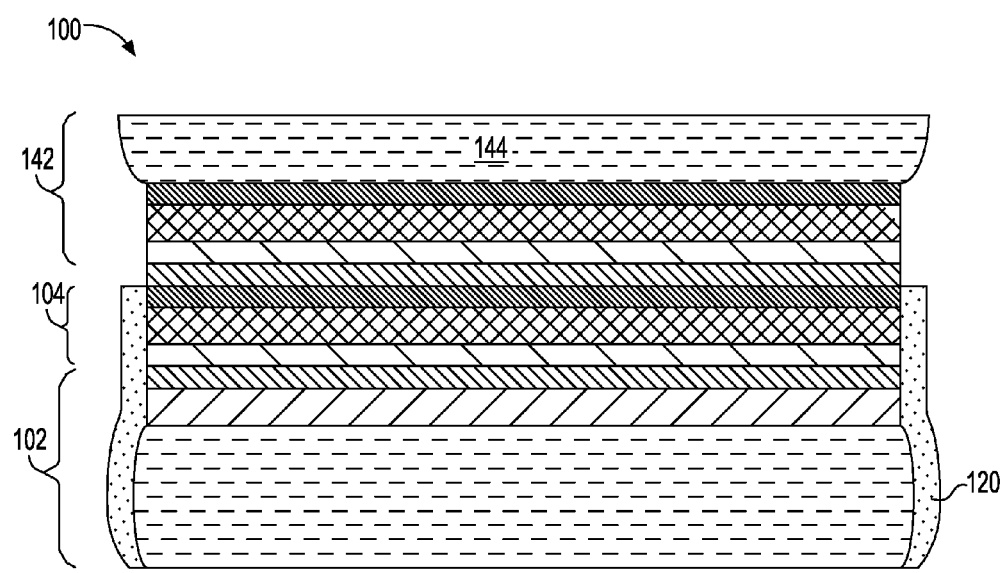

That is, the bonded semiconductor wafers 100, now including third semiconductor wafer 142, may undergo a first conventional thinning operation, preferably but not exclusively mechanical grinding, to reduce the thickness of the bulk silicon substrate 144 to a predetermined dimension as shown in FIG. 8.

Figure 9:
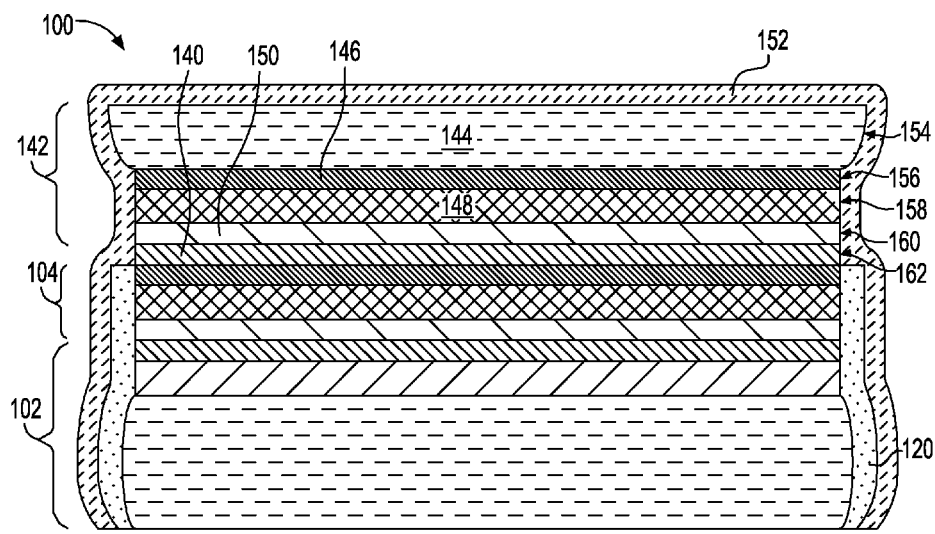

Referring now to FIG. 9, a conformal protective layer 152 is applied to the bonded semiconductor wafers 100 as before. The protective layer 152 covers the top of bulk silicon substrate 144 as well as the edges 154, 156, 158, 160, 162, respectively, of bulk silicon substrate 144, optional epitaxial layer 146, device layer 148, and bonding layers/interfaces 150, 140. The protective layer 152 also covers, preferably entirely as shown in FIG. 9, the protective layer 120.

Figure 10:
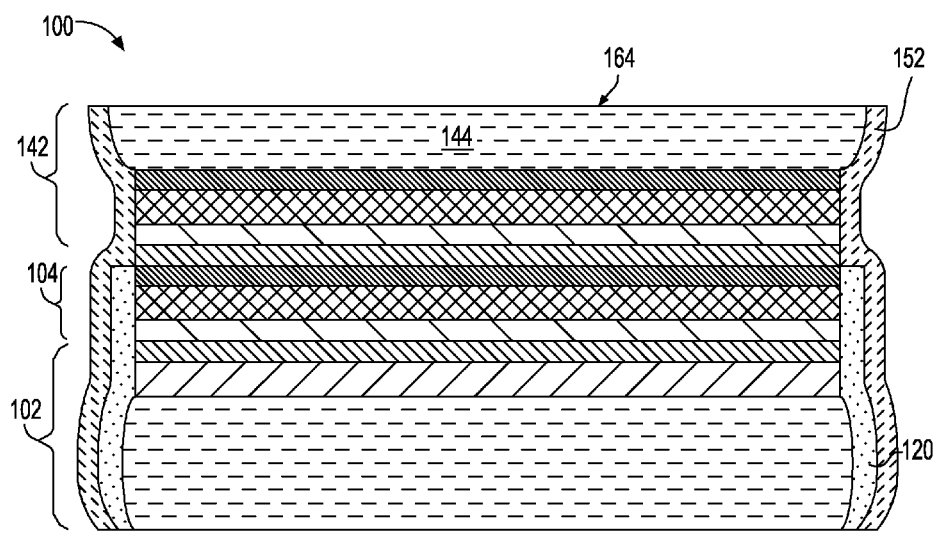

The semiconductor wafers 100 may now undergo another thinning operation, preferably but not exclusively mechanical grinding, to remove the protective layer 152 from bulk silicon substrate 144 to expose surface 164 of bulk silicon substrate 144 as shown in FIG. 10. This thinning operation may not appreciably reduce the thickness of the semiconductor wafer 142.

Figure 11:
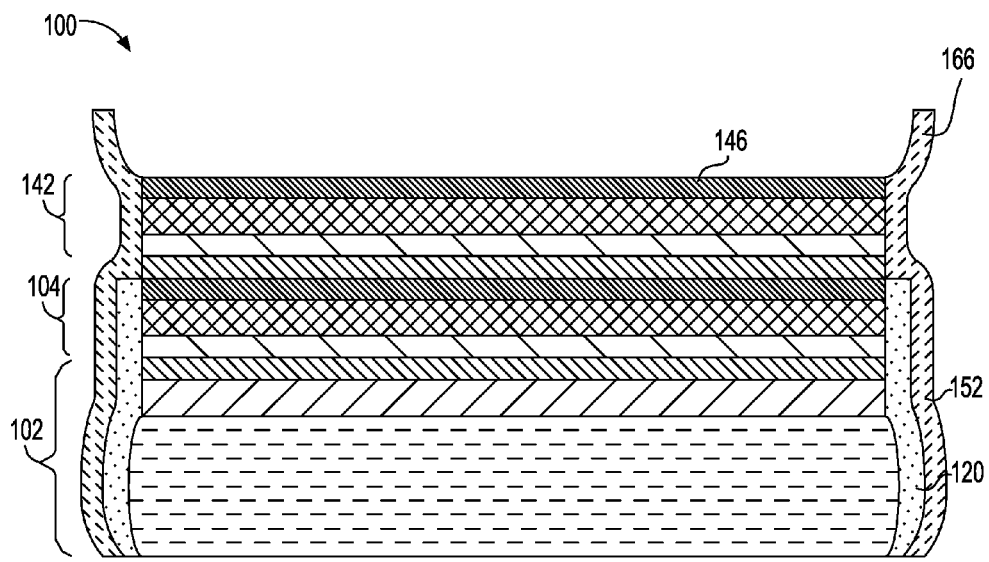
Figure 12:
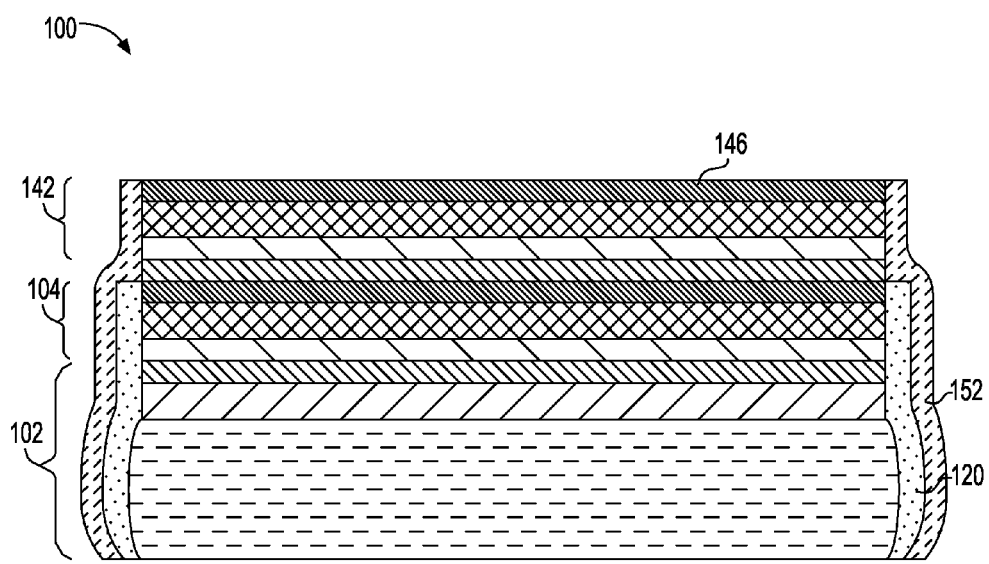

In an exemplary embodiment, the third semiconductor wafer 142 may be thinned, preferably by wet etching, to a final predetermined dimension and preferably stops on optional epitaxial layer 146 (or device layer 148 if the optional epitaxial layer 146 is not present) as shown in FIG. 11. Possible remnants 166 of the protective layer 152 may remain as shown in FIG. 11. If such remnants 166 are present, a light polish may be performed to remove the remnants 166, resulting in the semiconductor wafers 100 shown in FIG. 12.

While three semiconductor wafers are shown in FIGS. 7 to 13, further semiconductor wafers may be added to the stack of semiconductor wafers 100 and processed in a manner as just described.

The protective layers 120 and 152 are maintained in place during subsequent processing operations which may include back end of the line wiring and forming of through silicon vias that may provide interconnection between first semiconductor wafer 102, second semiconductor wafer 104 and third semiconductor wafer 142. The protective layers 120 and 152 protect the edges of the various layers of the bonded semiconductor wafers 100 including the bonding layers/interfaces during processing operations, such as wet etching, that may attack the edges of the various layers of the bonded semiconductor wafers 100.

Figure 13:
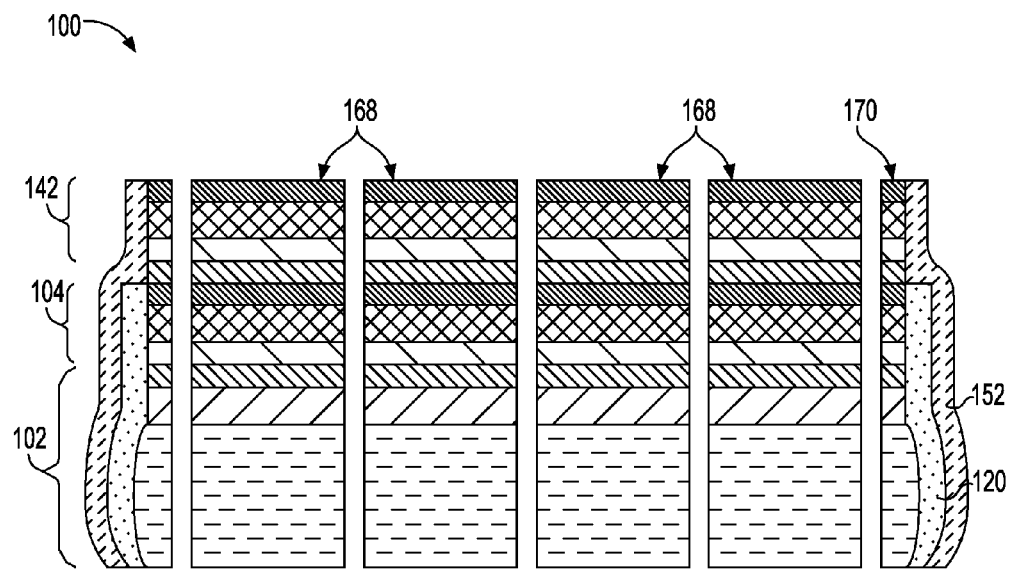

After all processing of the bonded semiconductor wafers 100 may be completed, the bonded semiconductor wafers 100 may be diced into 3D semiconductor chips 168 as shown in FIG. 13. As shown in FIG. 13, there are four 3D semiconductor chips 168 but there will usually be many more such 3D semiconductor chips 168 from bonded semiconductor wafers 100. The kerf 170 containing the protective layers 120 and 152 may be discarded.

A second exemplary embodiment is illustrated in FIGS. 1, 2 and 14 to 26. The processing of the second exemplary embodiment is similar to the first exemplary embodiment except where indicated.

The second exemplary embodiment begins as previously described with reference to FIGS. 1 and 2.

Figure 14:
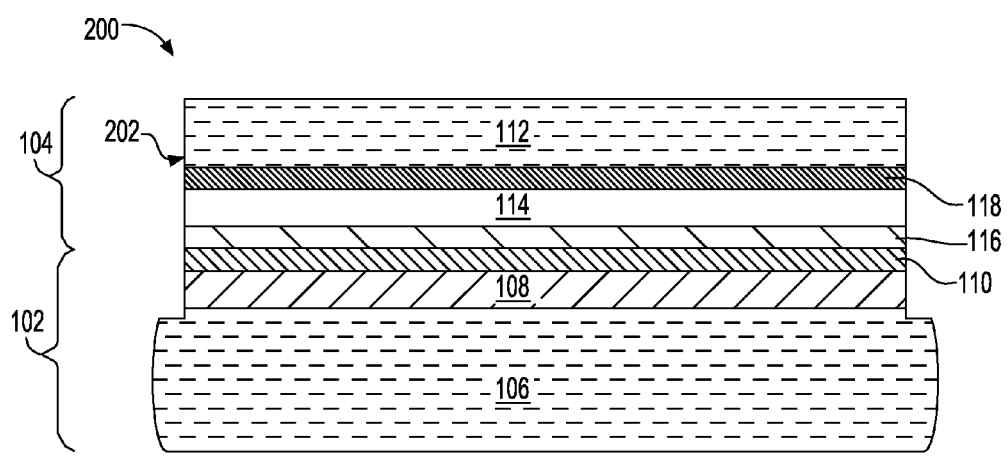

Referring now to FIG. 14, the bonded semiconductor wafers 100 may have undergone a conventional wafer edge trimming process after an initial thinning process, where edge portions of the first semiconductor wafer 102 and second semiconductor wafer 104 may be removed to result in a sidewall 202 above an upper surface of bulk silicon substrate 106. The bonded semiconductors may be referred to hereafter in this second exemplary embodiment as bonded semiconductor wafers 200. The edge trim profile is depicted in the Figures as a vertical sidewall (sidewall 202) for simplicity but in reality, the sidewall 202 may be sloped and uneven.

Figure 15:
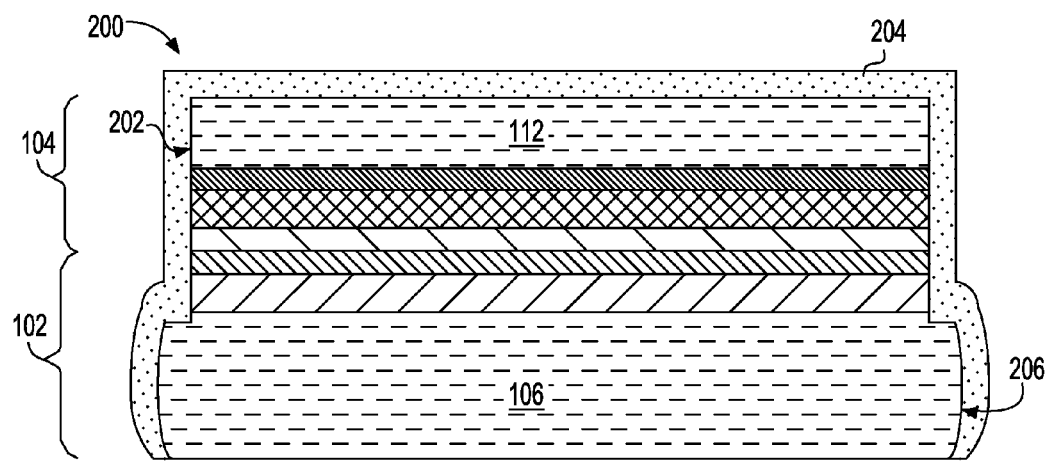

Referring now to FIG. 15, a conformal protective layer 204 is applied to the bonded semiconductor wafers 200 in a manner as previously described. The protective layer 204 covers the top of bulk silicon substrate 112 as well as sidewall 202. In an exemplary embodiment, the protective layer 204 at least partially covers the edge 206 of bulk silicon substrate 106 and, most preferably, entirely covers the edge 206 of bulk silicon substrate 106.

Figure 16:
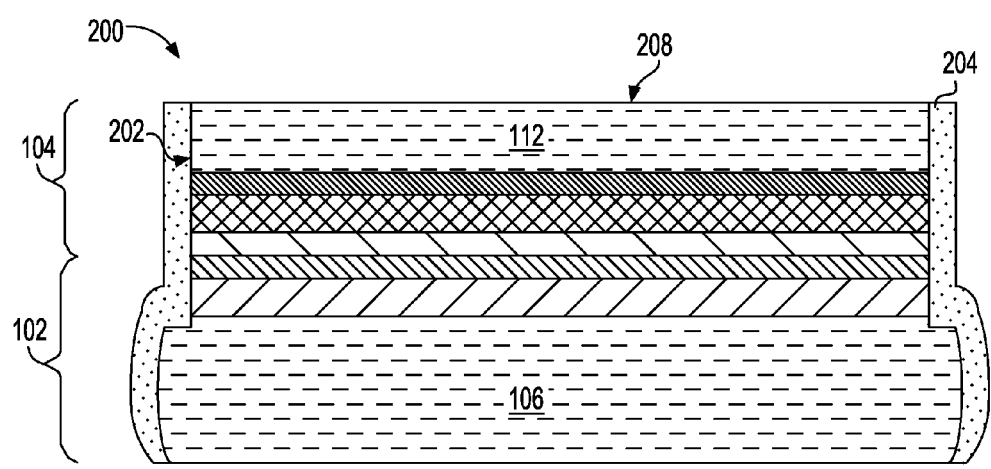

The semiconductor wafers 200 may now undergo another thinning operation, preferably but not exclusively mechanical grinding, to remove the protective layer 204 from the top of bulk silicon substrate 112 to expose surface 208 of bulk silicon substrate 112 as shown in FIG. 16. This thinning operation may not appreciably reduce the thickness of the semiconductor wafer 104.

Figure 17:
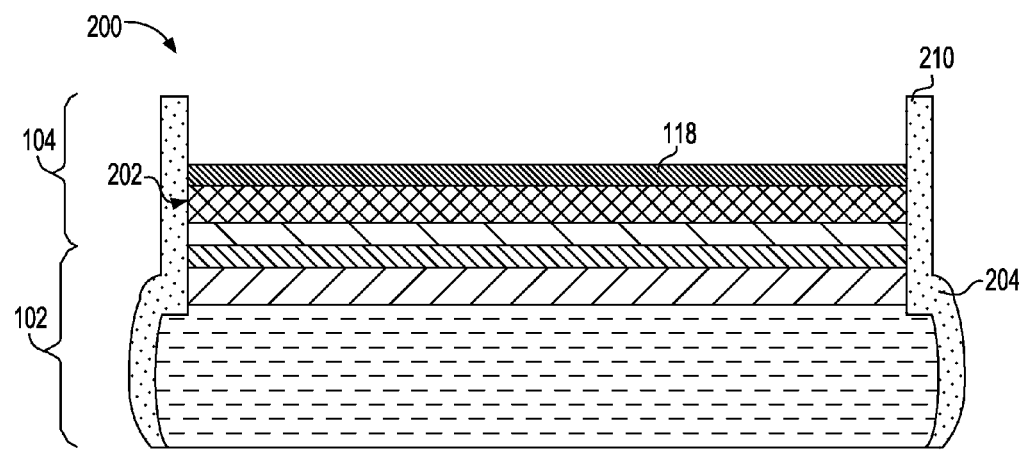
Figure 18:
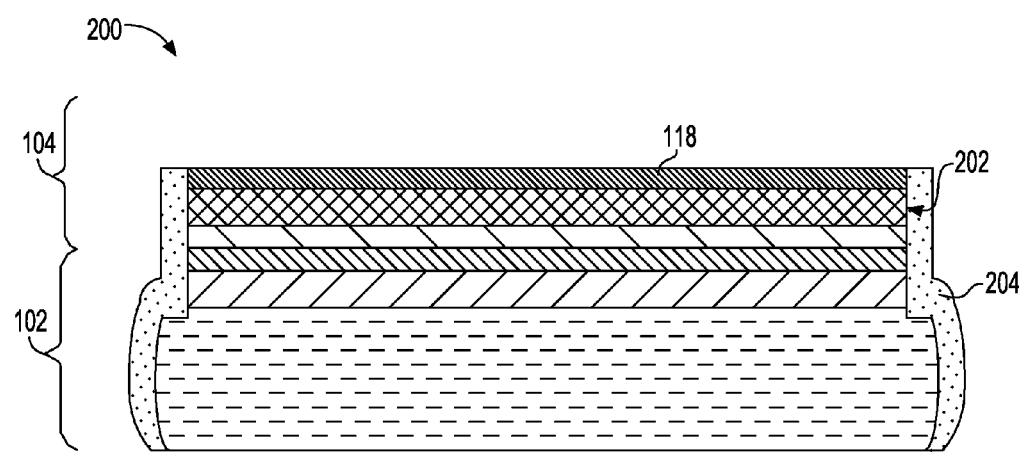

A further operation may be performed to reduce the thickness of the bulk silicon substrate 112 to a final predetermined dimension. In an exemplary embodiment, the thinning of the bulk silicon substrate 112 may stop on optional epitaxial layer 118 (or device layer 148 if the optional epitaxial layer 118 is not present). While the thinning of the bulk silicon substrate 112 to the final predetermined dimension may be by a grinding and polishing process, it is preferred that this thinning operation is by a wet etching process to reduce the possibility of cracks and chips in the bonded semiconductor wafers 200. As a result of the wet etching process, possible remnants 210 of the protective layer 204 may remain as shown in FIG. 17. If such remnants 210 are present, a light polish may be performed to remove the remnants 210, resulting in the semiconductor wafers 200 shown in FIG. 18. At this point in the processing, after the second semiconductor wafer 104 is sufficiently thinned, processing may continue in order to electrically connect the semiconductor wafers 102, 104 by use of through silicon vias and back end of line wiring. It is also possible that semiconductor wafer stacking may continue in the same fashion and such connections may be established later when more semiconductor wafers have been stacked.

Figure 19:
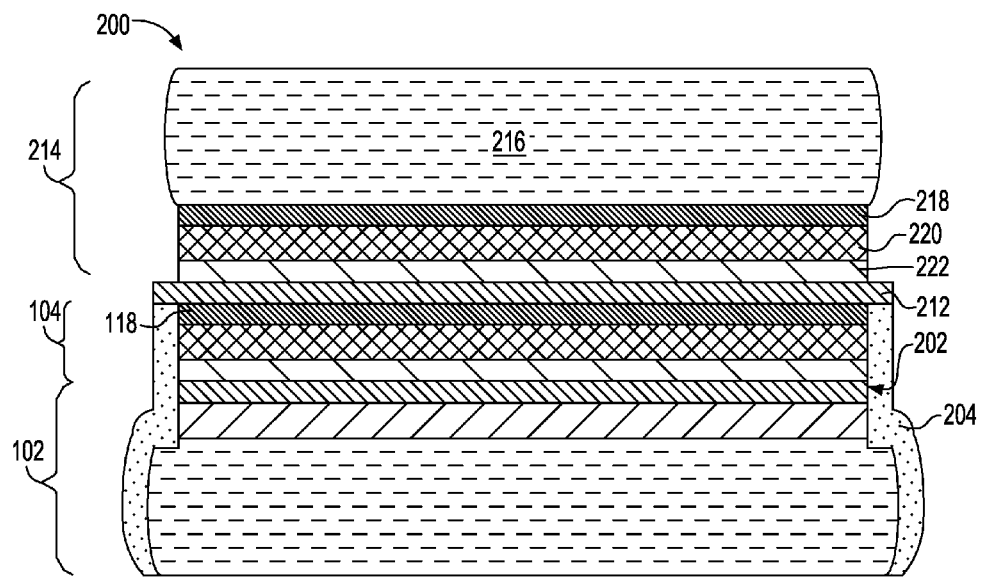

Referring now to FIG. 19, a bonding layer/interface 212 may be applied to semiconductor wafer 104, for example to epitaxial layer 118, followed by the bonding of a third semiconductor wafer 214 to the bonding layer/interface 212. Preferably, the bonding layer/interface 212 may extend to the edge of the conformal protective layer 204 as shown in FIG. 19. Third semiconductor wafer 214 may comprise a bulk silicon substrate 216, an optional epitaxial layer 218, a device layer 220 and a bonding layer/interface 222.

Third semiconductor wafer 214 may be processed in much the same way as second semiconductor wafer 104 was processed.

Figure 20:
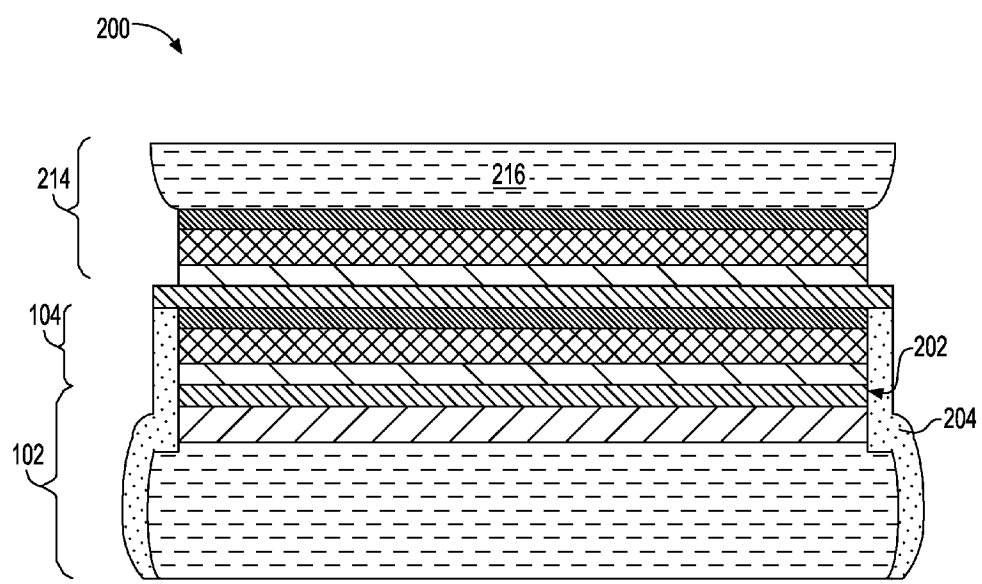

That is, the bonded semiconductor wafers 200, now including third semiconductor wafer 214, may undergo a first conventional thinning operation, preferably but not exclusively mechanical grinding, to reduce the thickness of the bulk silicon substrate 216 to a predetermined dimension as shown in FIG. 20.

Figure 21:
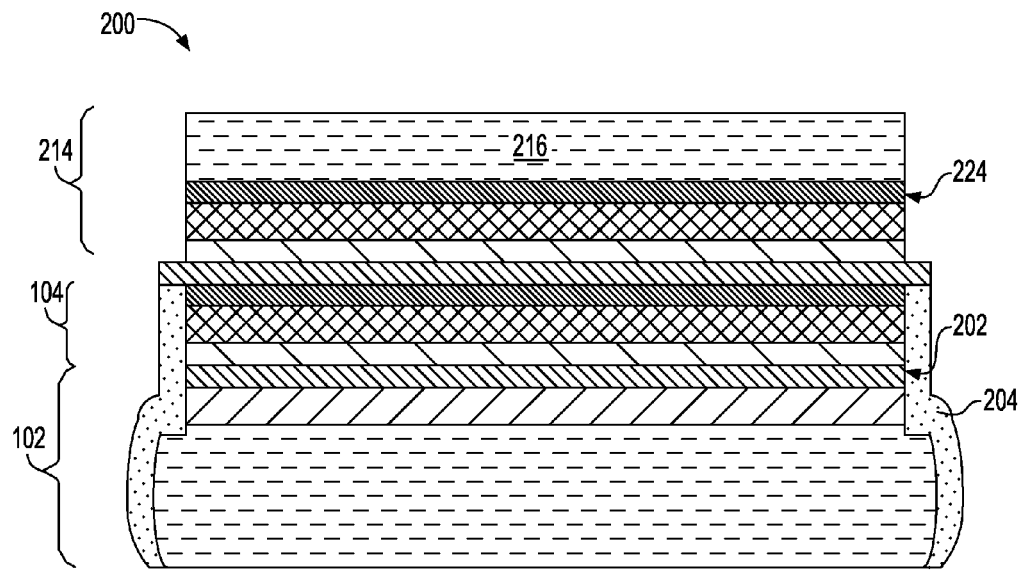

Third semiconductor wafer 214 may now undergo a wafer edge trimming process as discussed previously where edge portions of the third semiconductor wafer 214 may be removed to result in a sidewall 224 as shown in FIG. 21.

Sidewall 224 may be approximately aligned with sidewall 202. It is also within the scope of the exemplary embodiments for the wafer edge trimming process to trim third semiconductor wafer 214 slightly more than semiconductor wafer 104 so that sidewall 224 is offset from sidewall 202.

Figure 22:
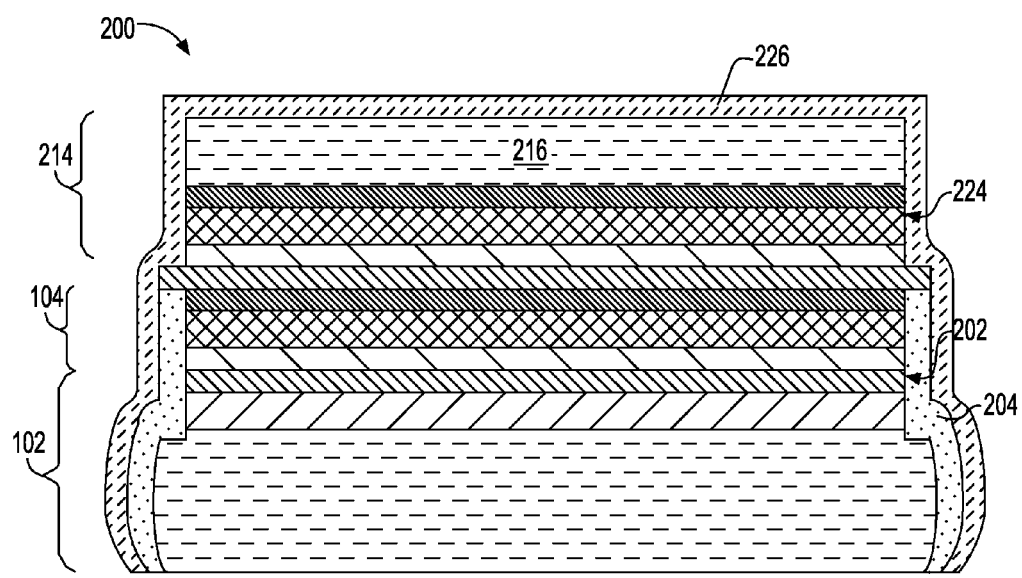

Referring now to FIG. 22, a conformal protective layer 226 may be applied to the bonded semiconductor wafers 200 as before. The protective layer 226 covers the top of bulk silicon substrate 216 as well as the sidewall 224. The protective layer 226 also covers, preferably entirely covers as shown in FIG. 22, the protective layer 204.

Figure 23:
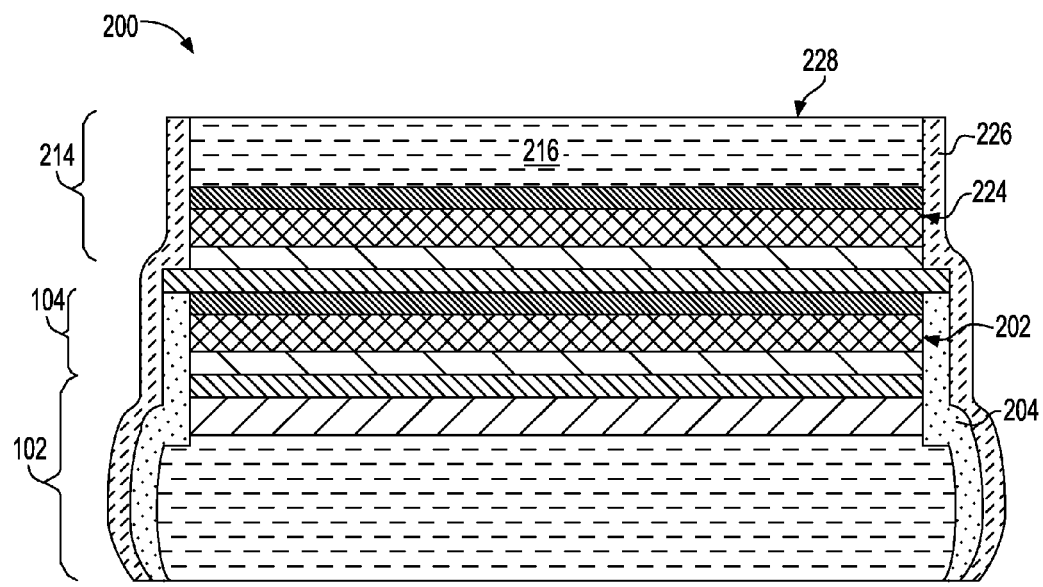

The semiconductor wafers 200 may now undergo another thinning, preferably but not exclusively mechanical grinding, operation to remove the protective layer 226 from the top of bulk silicon substrate 216 to expose surface 228 of bulk silicon substrate 216 as shown in FIG. 23. This thinning operation may not appreciably reduce the thickness of the semiconductor wafer 214.

Figure 24:
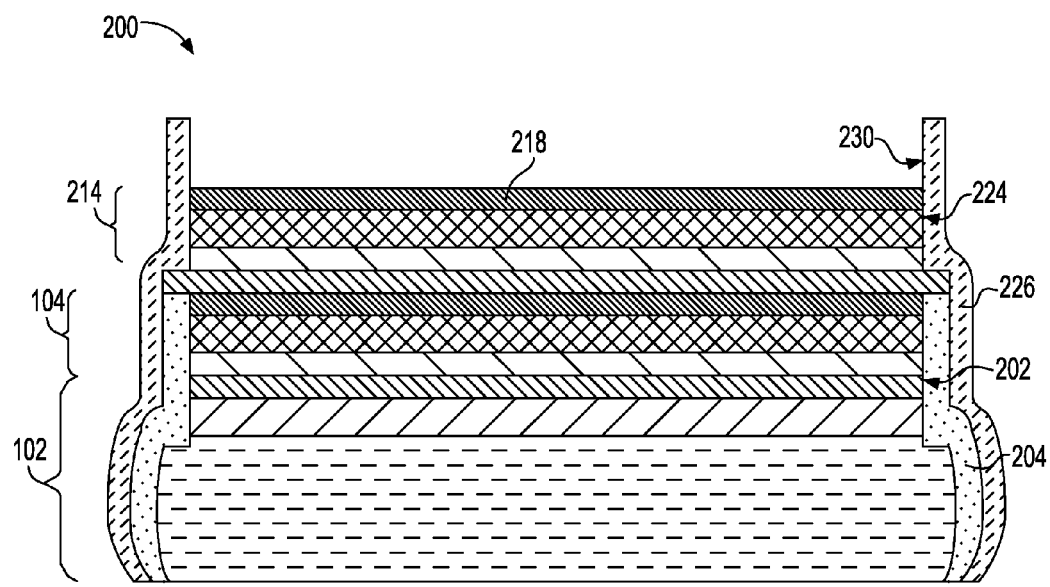
Figure 25:
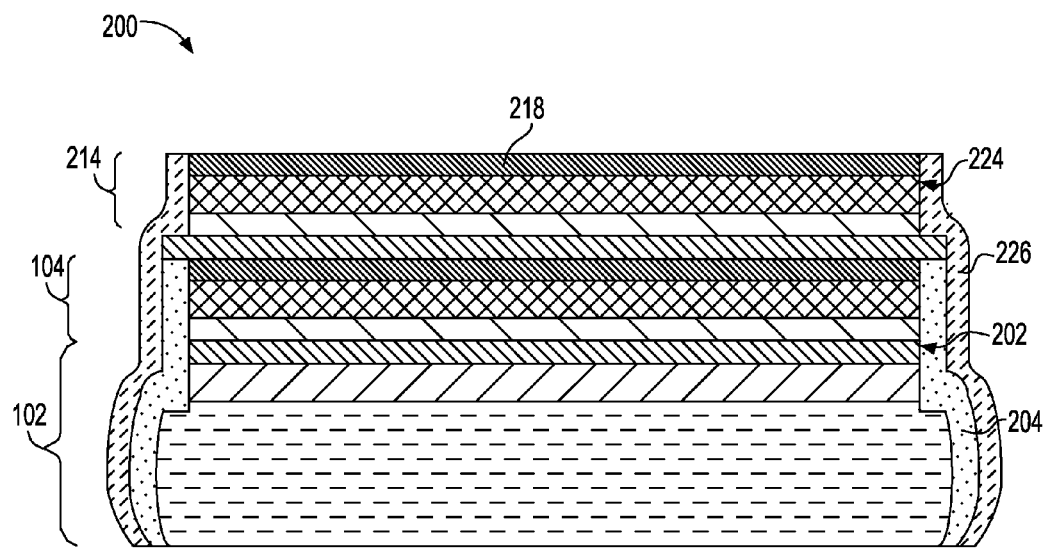

In an exemplary embodiment, the third semiconductor wafer 214 is thinned to a final predetermined dimension, preferably by a wet etch process, and preferably stops on optional epitaxial layer 218 (or device layer 220 if the optional epitaxial layer 218 is not present) as shown in FIG. 24. Possible remnants 230 of the protective layer 226 may remain as shown in FIG. 24. If such remnants 230 are present, a light polish may be performed to remove the remnants 230, resulting in the semiconductor wafers 200 shown in FIG. 25.

While three semiconductor wafers are shown in the Figures, further semiconductor wafers may be added to the stack of semiconductor wafers 200 and processed in a manner as just described.

The protective layers 204 and 226 are maintained in place during subsequent processing operations which may include back end of the line wiring and forming of through silicon vias that may provide interconnection between first semiconductor wafer 102, second semiconductor wafer 104 and third semiconductor wafer 214. The protective layers 204 and 226 protect the edges of the various layers of the bonded semiconductor wafers 200 including the bonding layers/interfaces during processing operations, such as wet etching, that may attack the edges of the various layers of the bonded semiconductor wafers 200.

Figure 26:
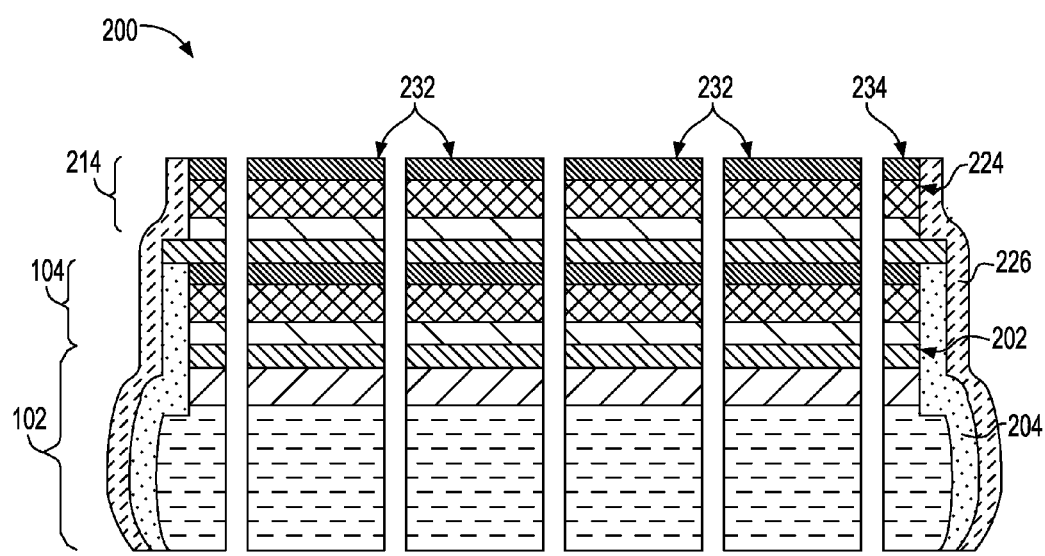

After all processing of the bonded semiconductor wafers 200 is completed, the bonded semiconductor wafers 200 may be diced into 3D semiconductor chips 232 as shown in FIG. 26. As shown in FIG. 26, there are four 3D semiconductor chips 232 but there will usually be many more such 3D semiconductor chips 232 from bonded semiconductor wafers 200. The kerf 234 containing the protective layers 204 and 226 is discarded.

Figure 27:
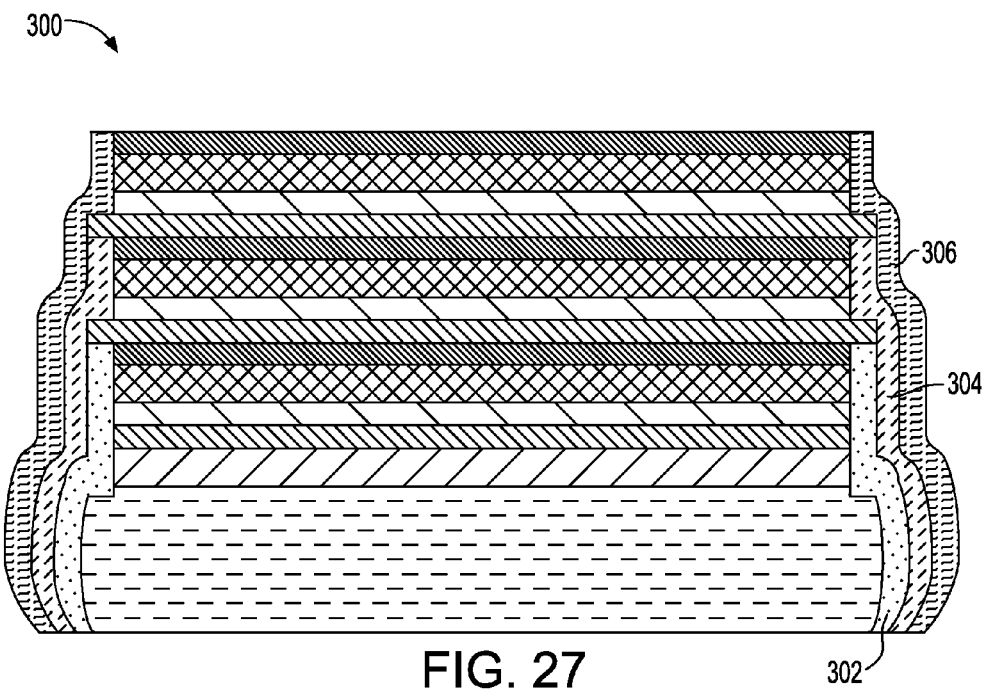
Figure 28:
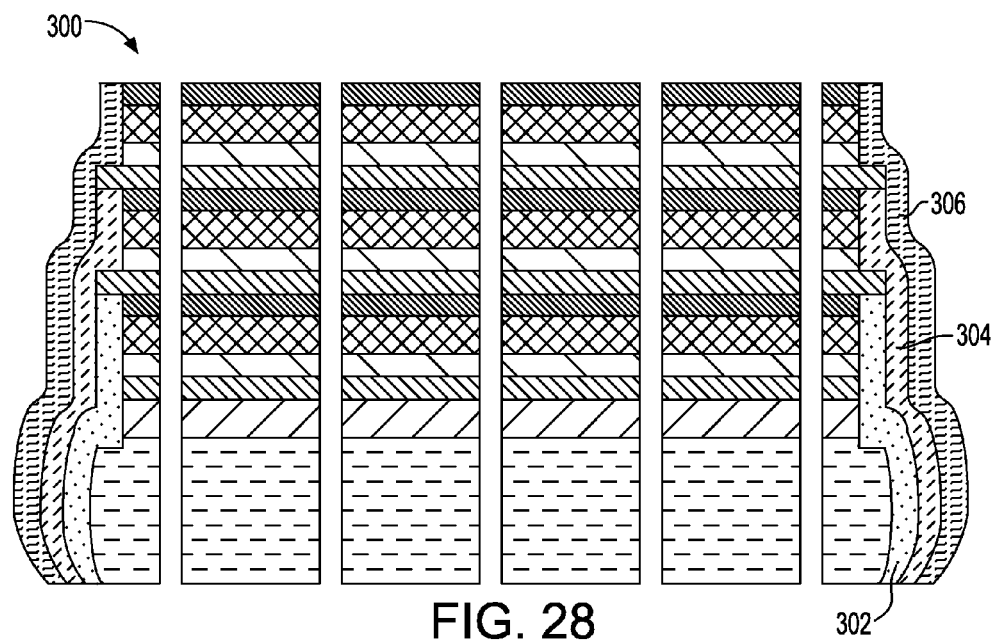

A third exemplary embodiment is illustrated in FIGS. 27 and 28.

Referring to FIG. 27, there is illustrated bonded semiconductor wafers 300 containing four bonded semiconductor wafers. Bonded semiconductor wafers 300 may be prepared according to the processing described with respect to the second exemplary embodiment. FIG. 27 illustrates that more than three semiconductor wafers may be prepared according to the exemplary embodiments. Each additional semiconductor wafer may add another protective layer so that bonded semiconductor wafers 300 may contain protective layers 302, 304, 306.

In FIG. 28, the bonded semiconductor wafers 300 may be diced to form multiple 3D semiconductor chips as discussed previously.

It should be understood that while bulk silicon wafers are used in the exemplary embodiments, bulk silicon wafers are used for the purpose of illustration and not limitation and other semiconductor materials known to those skilled in the art may be used in place of the bulk silicon wafers It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of edge protecting bonded semiconductor wafers comprising:
   providing a second semiconductor wafer having a first surface and a second surface opposite to the first surface;
   attaching the first surface of the second semiconductor wafer to a first semiconductor wafer by using a bonding layer/interface;
   thinning the second semiconductor wafer from the second surface to a first predetermined dimension;
   forming a first protective layer to entirely cover the second semiconductor wafer and at least a portion of an edge of the first semiconductor wafer;
   thinning the second semiconductor wafer from the second surface to a second predetermined dimension while maintaining the first protective layer on an edge only of the second semiconductor wafer and the edge only of the first semiconductor wafer;
   providing a third semiconductor wafer having a first surface and a second surface opposite to the first surface;
   attaching the first surface of the third semiconductor wafer to the second surface of the second semiconductor wafer by using a bonding layer/interface, the third semiconductor wafer, second semiconductor wafer and first semiconductor wafer forming a semiconductor wafer stack;
   thinning the third semiconductor wafer from the second surface to a third predetermined dimension;
   forming a second protective layer to entirely cover the third semiconductor wafer and the first protective layer;
   thinning the third semiconductor wafer to a fourth predetermined dimension while maintaining the second protective layer on an edge only of the third semiconductor wafer and on the first protective layer; and
   dicing the semiconductor wafer stack with the maintained second protective layer and first protective layer into a plurality of three dimensional chip stacks, each of the three dimensional chip stacks being devoid of the second protective layer and the first protective layer.

2. The method of claim 1 wherein the first predetermined dimension equals the third predetermined dimension and the second predetermined dimension equals the fourth predetermined dimension.

3. The method of claim 1 wherein thinning the second semiconductor wafer to a second predetermined dimension and thinning the third semiconductor wafer to a fourth predetermined dimension is by a wet etching process.

4. The method of claim 1 further comprising a first edge trimming process to trim a lateral dimension of the second semiconductor wafer and a second edge trimming process to trim a lateral dimension of the third semiconductor wafer.

5. The method of claim 1 wherein the first protective layer and the second protective layer each comprise a silicon nitride, silicon carbide or silicon carbonitride (NBLOK).

6. The method of claim 1 wherein the first protective layer entirely covers the edge of the first semiconductor wafer.

7. A method of edge protecting bonded semiconductor wafers comprising:
   providing a second semiconductor wafer having a first surface and a second surface opposite to the first surface;
   attaching the first surface of the second semiconductor wafer to a first semiconductor wafer by using a bonding layer/interface, the second semiconductor wafer and the first semiconductor wafer forming a semiconductor wafer stack;
   thinning the second semiconductor wafer from the second surface to a first predetermined dimension;
   forming a first protective layer to entirely cover the second semiconductor wafer and at least a portion of an edge of the first semiconductor wafer;
   thinning the second semiconductor wafer from the second surface to a second predetermined dimension while maintaining the first protective layer on an edge only of the second semiconductor wafer and the edge only of the first semiconductor wafer;
   bonding an additional semiconductor wafer to, and become part of, the semiconductor wafer stack according to the following process:
      providing an additional semiconductor wafer having a first surface and a second surface opposite to the first surface;
      attaching the first surface of the additional semiconductor wafer to the second surface of a preceding semiconductor wafer by using a bonding layer/interface;
      thinning the additional semiconductor wafer from the second surface to a first predetermined dimension with respect to the additional semiconductor wafer;
      forming an additional semiconductor wafer protective layer to entirely cover the additional semiconductor wafer and a preceding protective layer; and
      thinning the additional semiconductor wafer to a second predetermined dimension with respect to the additional semiconductor wafer while maintaining the additional semiconductor wafer protective layer on an edge only of the additional semiconductor wafer and on the preceding protective layer; and
   dicing the semiconductor wafer stack with the maintained additional semiconductor wafer protective layer and preceding protective layer into a plurality of three dimensional chip stacks, each of the three dimensional chip stacks beinq devoid of the additional semiconductor wafer protective layer, the preceding protective layer and the first protective layer, wherein when the additional semiconductor wafer is a third semiconductor wafer, the preceding protective layer and the first protective layer are the same layer.

8. The method of claim 7 further comprising repeating the process of bonding an additional semiconductor wafer to, and become part of, the semiconductor wafer stack to add at least one additional semiconductor wafer to the semiconductor wafer stack.

9. The method of claim 7 wherein thinning the second semiconductor wafer to a second predetermined dimension and thinning the additional semiconductor wafer to a second predetermined dimension is by a wet etching process.

10. The method of claim 7 further comprising a first edge trimming process to trim a lateral dimension of the second semiconductor wafer and a second edge trimming process to trim a lateral dimension of the additional semiconductor wafer.

11. The method of claim 7 wherein the protective layer and the additional semiconductor wafer protective layer each comprise a silicon nitride, silicon carbide or silicon carbonitride (NBLOK).

12. The method of claim 7 wherein the protective layer entirely covers the edge of the first semiconductor wafer.

13. Edge protected bonded semiconductor wafers comprising:
- a second semiconductor wafer having a first surface and a second surface opposite to the first surface, the first surface of the second semiconductor wafer attached to a first semiconductor wafer by using a bonding layer/interface;
- a first protective layer formed to entirely cover an edge of the second semiconductor wafer and an edge of the first semiconductor wafer, the first protective layer being limited to cover only the edges of the first and second semiconductor wafers;
- a third semiconductor wafer having a first surface and a second surface opposite to the first surface, the first surface of the third semiconductor wafer attached to the second surface of the second semiconductor wafer by using a bonding layer/interface; and
- a second protective layer to entirely cover an edge of the third semiconductor wafer and the first protective layer, the second protective layer being limited to cover only the edge of the third semiconductor wafer and the first protective layer.

14. The edge protected wafers of claim 13 wherein a lateral dimension of the second semiconductor wafer is trimmed prior to attachment to the first semiconductor wafer.

15. The edge protected wafers of claim 14 wherein a lateral dimension of the third semiconductor wafer is trimmed after attachment to the second semiconductor wafer.

16. The method of claim 13 wherein the first protective layer and the second protective layer each comprise a silicon nitride, silicon carbide or silicon carbonitride (NBLOK).

17. The method of claim 13 wherein the first protective layer entirely covers the edge of the first semiconductor wafer.

* * * * *